United States Patent [19]

Dudley

[11] 4,334,188

[45] Jun. 8, 1982

[54] VOLTAGE DETECTOR USING AN OSCILLATOR AND COMPARATOR MEANS

[75] Inventor: Carl K. Dudley, Petersburg, Mich.

[73] Assignee: Eltra Corporation, Toledo, Ohio

[21] Appl. No.: 118,943

[22] Filed: Feb. 6, 1980

[51] Int. Cl.³ .................... H04B 1/02; G01R 31/02; G08B 21/00; H03K 5/153

[52] U.S. Cl. .................... 324/133; 324/51; 307/311; 307/356; 340/661

[58] Field of Search .............. 324/72.5, 122, 133, 324/149, 51; 340/648, 660, 661; 307/362, 355, 356, 311

[56] References Cited

U.S. PATENT DOCUMENTS 4,024,525  5/1977  Baumgartner et al. ............. 340/648
4,152,656  5/1979  Udvardi-Lakos ................... 340/661

Primary Examiner—Gerard R. Strecker
Assistant Examiner—Walter E. Snow
Attorney, Agent, or Firm—James P. DeClercq

[57] ABSTRACT

A wear-indicating brush and warning circuit adapted to convey an indication to an operator that a dynamoelectric machine provided with such a brush is in need of maintenance before the brush wears to the point that a rotor contact surface is damaged by contact with electrical connections to the brush are disclosed. A brush (10) having current carrying pigtail leads (16) embedded therein includes a wear-detecting wire (20) embedded in the brush a short distance (A) beyond the lowest extent of the pigtail leads (16). The wire (20) is insulated over its periphery, including its tip (24), the insulation (26) being abraded by contact with the rotor contact surface (50), so that the wire (20) senses the voltage present thereon. Non-latching warning circuits (66, 66a) are disclosed, with and without the use of an isolating resistor within the dynamoelectric machine to permit the use of a single wire between the machine and the warning circuit.

Also disclosed is a warning circuit for indicating that an input is electrically connected to a voltage, for indicating that a line (20) has contacted a rotor contact surface. The voltage sensed may be negative or positive, over a wide range, so that the positioning and number of brushes (10) is irrelevant. The circuit (92) includes an oscillating voltage source (122) and comparison circuits (122, 124, 128) giving a warning indication when an input line is connected to a voltage and is unable to follow the oscillating voltage.

4 Claims, 10 Drawing Figures

VOLTAGE DETECTOR USING AN OSCILLATOR AND COMPARATOR MEANS

CROSS REFERENCE TO RELATED APPLICATIONS

This application is related to U.S. patent application Ser. No. 118,944, filed Feb. 6, 1980, now abandoned, entitled "BRUSH-WEAR DETECTION IN DYNAMOELECTRIC MACHINES" and to U.S. patent application Ser. No. 118,945, filed Feb. 6, 1980, now U.S. Pat. No. 4,316,186, entitled "BRUSH WEAR DETECTION AND WARNING SYSTEM".

FIELD OF THE INVENTION

The instant application relates to the field of detecting wear of motor or generator brushes to signal the need of brush replacement before damage to a rotor contact surface occurs. In particular, the instant application relates to a modified brush that may be used in an conventional brush holder to provide a signal when brush wear reaches a predetermined amount, and a warning circuit for use with such brushes, suitable of use with a plurality of dynamoelectric machines.

BACKGROUND OF THE INVENTION

Rotating dynamoelectric machinery, such as motors and generators, whether utilizing or generating alternating current or direct current, have a rotor contact surface, such as commutator or slip rings, fixed to the rotating armature or rotating field, and electrically connected to windings of the rotating armature or rotating field. The windings of the rotating armature or rotating field are connected through brushes or the like which make sliding electrical contact with the rotor contact surface, and are connected to the fixed winding being independently connected to an external power source. A fixed magnetic field may also be provided by permanent magnets.

Brushes are typically made of a carbon particulate, such as graphite, and a binder material, and may also include metallic particles. One or more holes are made in an end of the brush, to accommodate current carrying wires, or pigtails. For higher current operation, angled, intercepting, holes are drilled, and a rivet through the brush is installed at their intersection. The pigtail is looped through the angled holes and around the rivet, and soldered to the rivet. For lower current operation, a hole is made in the end of the brush, the pigtail wire is inserted, and metallic or other conductive particles are tamped in the hole around the pigtail wire to hold it in place.

In order to provide a sliding contact which does not cause significant wear to the rotor contact surface, the brushes are made softer than the rotor contact surface, which is often made of a copper alloy. However, the conducting wires, or pigtails, are also made of copper alloy, and may damage the rotor contact surface after a sufficient amount of the brush wears away. In the rivet style brush, the rivet may contact the rotor contact surface, causing rapid and severe damage.

Many attempts have been made to avoid damage to the rotor contact surface, by providing a signal when a brush wears to a predetermined point, to allow the brush to be moved away from contact with the rotor contact surface when it has worn to a predetermined point. All these attempts have involved modification of a standard brush holder, requiring disassembly of the dynamoelectric machine, and substitution of new brush holding structure. U.S. Pat. No. 942,264, issued to Kimble on Dec. 7, 1909, entitled "BRUSH HOLDER" discloses a brush holder with a spring member which is normally seated in a cavity made in a brush, and is released from the cavity to hold the brush away from a commutator when the brush wears down to the point near the bottom of a cavity. U.S. Pat. No. 1,295,860, issued to Dean, on Mar. 4, 1919, entitled "BRUSH HOLDER", discloses the use of a flexible conductor attached to the pressure exerting device, rather than embedded in a brush, to conduct current, the conducting member being attached to the pressure exerting member, and the pressure exerting member being equipped with an extension which contacted the brush box to prevent the flexible conductor from contacting the brush box. U.S. Pat. No. 2,193,172, issued to Hills, on Mar. 12, 1940, entitled "SAFETY DEVICE FOR GENERATORS", discloses the use of a bracket attached to a cantilevered, pivoting brush holder, the bracket opening a leaf-type switch when the brush wears to a predetermined point, the leaf switch members being formed of different types of metal so as to also open when the generator overheats. U.S. Pat. No. 2,691,114, issued to Lykins, on Oct. 5, 1954, entitled "GENERATOR BRUSH WITH CONDUCTION INDICATOR", discloses the use of a spring-urged clip bearing on the brush, a resilient contact member being provided on, and insulated from, the spring-urged clip, the contact member being engagable with an end of the brush holder upon excess wear of the brush. U.S. Pat. No. 2,813,208, issued to Ritter, on Nov. 12, 1957, entitled "ELECTRICAL CONTACT BRUSH", discloses the use of a spring-biased plunger in a recess in the body of the brush, the plunger being adapted to push the brush away from the commutator surface when the brush wears to the bottom of the recess. U.S. Pat. No. 3,523,288, issued to Thompson, on Aug. 4, 1970, entitled "BRUSH WEAR INDICATOR", discloses the use of a brush having a recess or protuberance thereon, a cantilevered resilient arm attached to the brush holder, which either bears a pin which falls into a recess in the brush when the brush has worn to a predetermined point, or falls off the end of a protuberance on the brush when the brush has worn to a predetermined point, operating an electrical switch. In this manner, although the lead wire is prevented from touching the commutator due to its length, an indication is given to allow replacement of brushes before arcing from the brush to commutator can damage the commutator. U.S. Pat. No. 3,609,429, issued to Thompson, on Sept. 28, 1971, entitled "BRUSH WEAR INDICATOR", discloses the use of a pin falling into a recess in the brush when the brush has worn to a predetermined point, allowing the contact arm to contact the brush holder, and provide a signal that the brush should be replaced. U.S. Pat. No. 3,898,492, issued to Vassos et al., on Aug. 5, 1975, entitled "CURRENT INTERRUPTING BRUSH HOLDER ASSEMBLY", discloses the use of a current carrying trip member which is released from an arm on the brush when the brush wears down to predetermined length, and also discloses the use of a separate contact member sandwiched between a spring and the brush which engages stops on the brush holder, allowing the brush to all away when it has worn to a predetermined length, and further discloses the use of a wedge-shaped contact sandwiched between the spring and the brush, which aligns with a recess in the brush holder when the brush has worn to a predetermined length, and is forced out of contact with the brush by the spring, stopping the motor. U.S. Pat. No. 4,024,525, issued to Baumgartner et al., on May 17, 1977, entitled "BRUSH WEAR INDICATOR", discloses the use of a motor brush having an elongated groove formed in one side, and a brush box having an insulated probe protruding into the groove. As the brush wears to a predetermined point, an end of the groove contacts the insulated probe, providing a signal to indicate that the brush has worn. The movement of the brush may also be restrained, creating the possibility of commutator damage from arching. Also disclosed is a latching warning device connected to the insulated probe. U.S. Pat. No. 4,121,207, issued to Jones, on Oct. 17, 1978, entitled "SWITCH FOR INDICATING BRUSH WEAR", discloses the use of a conventional roller-arm microswitch adjacent a brush box, the roller bearing against a brush through a opening in the brush box. The switch is actuated when the brush has worn to the point where the roller falls off the end of the brush, actuating the switch, and providing an indication that the brush is worn. U.S. Pat. No. 4,172,988, issued to Lowther, on Oct. 30, 1979, entitled "BRUSH WEAR INDICATING MEANS WITH ENGAGABLE ELECTRICAL CONTACTS", discloses the use of a Z-shaped contact element bonded to the top of a brush, the contact element contacting an isulated contact provided on the brush holder when the brush has worn to a predetermined point.

The instant invention provides a brush wear indicating means which avoids the deficiencies and difficulties of previous attempts to provide a signal indicative of brush wear to predetermined length.

SUMMARY OF THE INVENTION

It is an object of the invention to provide a brush with an embedded, insulated wear detecting wire, which will contact the rotor contact surface, drawing power therefrom to operate a warning device, when the brush has worn to a predetermined point, and the insulation has worn from the embedded wire by sliding contact with the rotating rotor contact surface.

It is an advantage of the invention that a means of indicating brush wear before damage to the rotor contact surface occurs may be provided without modification to the brush holding structure of a motor or generator.

It is a feature of the invention that the insulated wire is insulated both around its periphery and at its tip, and is embedded in a brush to protrude into the brush a slight distance beyond the end of the pigtail wire.

It is a further object of the invention to provide a warning circuit for detecting brush wear in a plurality of dynamoelectric machines, wherein each machine may have a single wire between it and the warning circuit, and every brush in the dynamoelectric machine may be simultaneously monitored for excessive wear.

It is an advantage of the invention that no devices which are substantially affected by temperature need be provided within a dynamoelectric machine used in conjunction with the warning circuit.

It is a feature of the invention that the warning circuit includes an oscillator, and compares a oscillating voltage with the voltage on the single wear detecting signal wire from each dynamoelectric machine to determined when a wear-detecting contact wire in that dynamoelectric machine has become connected to a voltage due to excessive wear of a brush.

It is a further object of the invention to provide a system including wear detecting brushes and a warning circuit for detecting brush wear in a plurality of dynamoelectric machines.

It is an advantage of the invention that the system provides a warning that a brush in a dynamoelectric machine has become excessively worn, and also provides a separate indication indicating which of a plurality of motors contains a brush that has become excessively worn.

DETAILED DESCRIPTION OF THE INVENTION

Before refering to the drawings, it should be clearly noted that the disclosed embodiments are illustrative only, since the facets of the invention shown have application beyond that presented as illustrative. For example, a wear-detecting brush may be use in either motors or generators, and may be used directly, or with an intermediate circuit, with a varity of indicators, including visible indicators, audio indicators, and electromechanical indicators such as annunciator flags, or a combination thereof. Wear-detecting brushes according to the invention may also be use in series with the coil of a relay, to stop a dynamometer when a dynamoelectric machine undergoing testing on the dynamometer has brushes that have reached the end of their useful life, without allowing brush wear to proceed to the point where a rotor contact surface is damaged.

The warning circuits illustrated as being connected to a single dynamoelectric machine may obviously be connected to more than one dynamoelectric machine, usin diodes or, preferably, isolating resistors between wear detecting wires embedded in like polarity brushes of different dynamoelectric machines. The dynamoelectric machines may be constant speed or variable speed, the speed control forming no part of the invention, and may be series wound, compound wound, permanent magnet, or other type of motor or generator. Certain disclosed warning circuits are equally applicable to alternating current and direct current dynamoelectric machines. It should be particularly noted that the disclosed warning circuit which determines when a wear detecting wire has made contact with an armature contact surface by comparing the voltage present on that lead with a oscillating voltage source has general applications for determining when any electrical lead has become connected to a source of voltage which is either substantially constant, or which does not vary at the same rate as that of the source of oscillating voltage, or which varies at the same rate, but with a greater amplitude.

Figure 1:
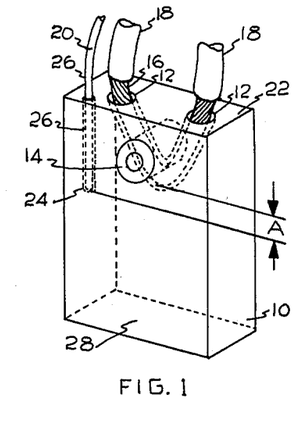
FIG. 1 is a perspective view showing the invention as embodied in a riveted brush.

Refering to the figures, FIGS. 1, 2, 3 and 4 show various embodiments of the invention in several configurations of brushes. FIG. 1 shows a brush 10 of the riveted type. As shown, intersecting holes 12 are made in brush 10. A loop of pigtail wire 16 is passed through hole 12, around rivet 14, and is usually subsequently soldered to rivet 14. Pigtail 16 is usually provided with insulating sleeves 18, for mechanical and electrical insulation. In accordance with the invention, an insulated sensing wire 20 is embedded in brush 10, and extends into brush 10 a distance A of approximately 0.06 inches (0.15 cm) beyond the lowest extent of pigtail 16, as measured from surface 22 of brush 10. Wear detecting wire 20 is insulated around its periphery, and at its tip 24. Insulation material 26 is, in the preferred embodiment, a fluorocarbon compound such as Teflon, although other high temperature isulations are also usable. The insulation used should withstand a temperature of about 200° C.

As will be apparent, a brush 10 is placed in contact with a rotor contact surface, not shown, which rotates beneath it and causes frictional wear on brush 10 at rotor contact surface 28. As brush 10 wears, surface 28 moves closer to surface 22, and, as wear progresses, surface 28 approaches tip 24 of sensing wire 20. As wear continues, the friction of the rotor contact surface will remove both material from brush 10 and insulation from tip 24 of wear detecting wire 20, allowing wire 20 to come into contact with the rotor contact surface. At this point, the voltage present on the rotor contact surface is also present on wire 20, which was previously insulated both from the brush and from the armature contact surface. In a brush according to the invention, wear of brush 10 may continue for a limited period of time following contact of wire 20 and the rotor contact surface, without incurring substantial damage to the rotor contact surface. Wire 20 is intentionally made with a soft stranded conductive material, such as a soft copper alloy or the like, and its diameter is chosen to be as small as practical, so that it can cause at most insubstantial damage to the rotor in comparison to the results of allowing the pigtail 16 or rivet 22 to contact the rotor. In the preferred embodiment, surface 28 of brush 10 may be worn away by the rotor contact surface for a distance A after wire 20 makes contact with the rotor contact surface before pigtail 16 or rivet 22 could come into contact with the rotor contact surface. This is to allow the dynamoelectric machine to be operated until the next opportunity for maintenance, and brush replacement, of the dynamoelectric machine, rather than causing a sudden shut down of the dynamoelectric machine, which is not desirable in most applications for dynamoelectric machines.

Figure 2:
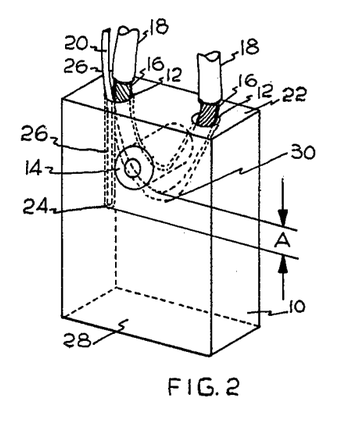
FIG. 2 is a perspective view showing an alternate embodiment of the invention in a riveted brush.

FIG. 2 illustrates a brush 10 which is substantially indentical to that shown in FIG. 1, except that wire 20 passes through surface 22 of brush 10 through hole 12 at surface 22. It is possible, although not desirable, that wire 20 could be lead into space 30 between the outer diameter of pigtail 16 and the inner diameter of hole 12, facing armature contact surface 28, since this would give poor practical control over the distance A, and could result in an undesirably small allowance for brush wear before maintenance of the dynamoelectric machine could be conveniently performed.

Figure 3:
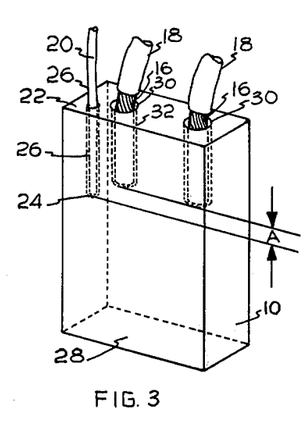
FIG. 3 is a perspective view showing the invention as embodied in a tamped brush having two pigtail leads.

FIG. 3 illustrates a brush 10 which is similar to the brush 10 shown in FIG. 1, except that it is a tamped-type brush, where pigtails 16 are inserted into holes 30 perpendicular to surface 22, and the space between pigtail 16 and hole 30 is filled with particulate material 23 which is tamped into hole 30 to retain pigtail 16 to brush 10.

Figure 4:
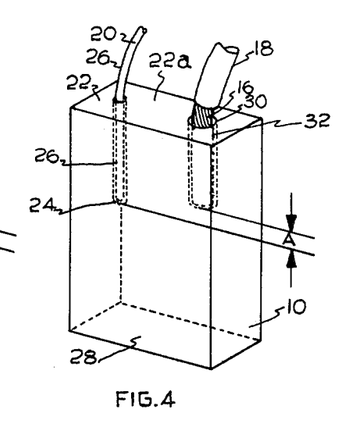
FIG. 4 is perspective view showing the invention as embodied in a tamped brush having a single pigtail lead.

FIG. 4 is similar to FIG. 3 and illustrates a tamped-type brush having only a single pigtail 16, with wear detecting wire 20 being located in the same general location as a second pigtail lead shown in FIG. 3. As would be apparent to one skilled in the art wear detecting wire should be positioned to avoid substantial weakening of the brush, although the brush does not require substantial strength in the area of sensing wire 20 as shown, and allow room for a resilient means to urge brush 10 into contact with an armature contact surface. In FIG. 4, central area 22a of brush top surface 22 is pressed upon by a spring of the like, not shown, to urge brush 10 against an armature contact surface, so that the preferred location for sensing wire 20 is as illustrated in FIG. 4.

Sensing wire 20 is preferably embedded in a brush in an aperture, not shown, which closely receives insulation 26 of sensing wire 20, and a high temperature glue is used to retain sensing wire 20 in brush 10. The retention of wire 20 in brush 10 may be improved by chemically etching insulation 26 of wire 20 before it is embedded in brush 10.

Figure 5:
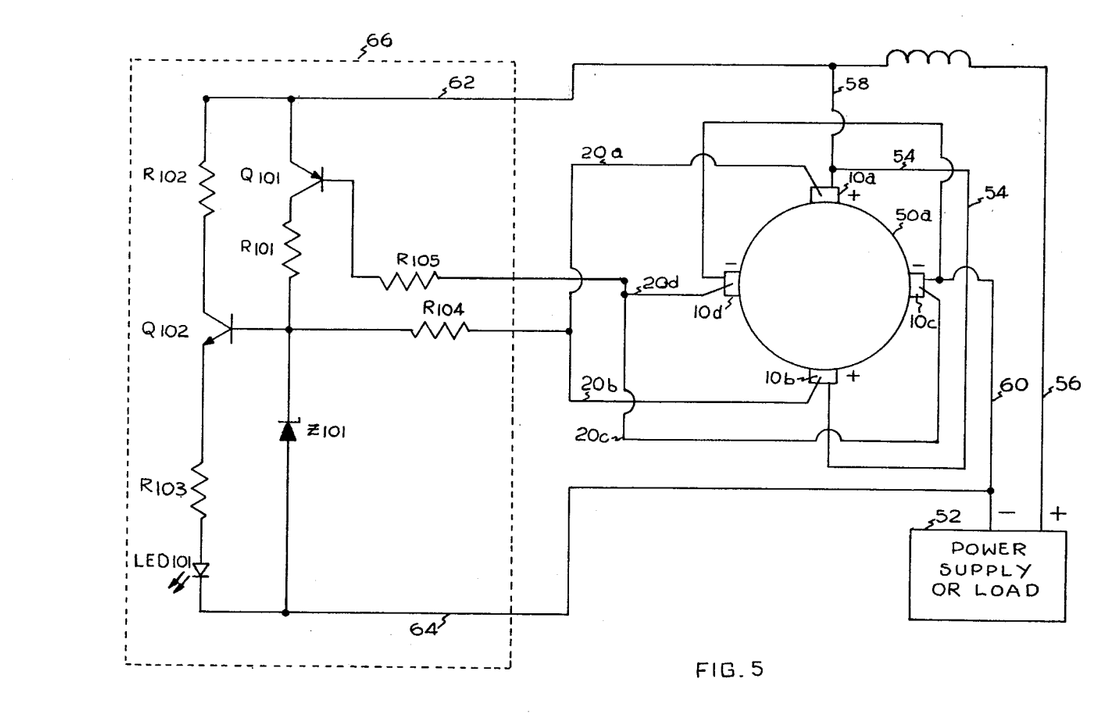
FIG. 5 illustrates a system according to the invention including wear detecting brushes, a series-field, non-reversing dynamoelectric machine, and a warning circuit.

FIG. 5 illustrates a brush wear detection system including a non-reversing series field dynamoelectric machine. As stated above, the type of dynamoelectric machine is not critical, and is not part of the invention. As shown, a rotor contact surface 50a is provided with a set of brushes 10 identified as 10a, 10b, 10c and 10d for convenience, and provided with wear detecting wires identified as 20a, 20b, 20c, and 20d. As shown in FIG. 5 brushes 10a and 10b are arranged in a first polarity about the rotor contact surface, and brushes 10c and 10d are arranged in a second polarity. Wear detecting wires 20a, 20b, 20c, and 20d are embedded in brushes 10a, 10b, 10c, and 10d, respectively. A power supply 52 supplies power to the dynamoelectric machine having rotor contact surface 50a through series field F1 and brushes 10a and 10b, which are electrically joined together by wire 54. The return path to power supply or load 52 is from brushes 10c and 10d, which are joined together by wire 54. Obviously, if the dynamoelectric machine having rotor contact surface 50a is a generator, power supply or load 52 serves as a load, and current flows from, rather than to brush 10a and 10b, using conventional terminology. In the system illustrated, a wire 56 electrically connects power supply or load 52 to field winding F1, which is connected in turn to brushes 10a and 10b through wire 58, which is also connected to wire 54. A wire 60 is connected between power supply or load 52 and brushes 10c and 10d.

Wires 62 and 64 are electrically connected to brushes 10a and 10b, and 10c and 10d, respectively, to supply power to a warning circuit 66. Warning circuit 66 has two branches in parallel between wires 62 and 64, the first branch being the series combination of the emitter and collector of transistor Q101, resistor R101, and Zener diode Z101, the second branch being the series combination of resistor R102, the collector and emitter or transistor Q102, resistor R103, and light emitting diode LED101. The base of transistor Q102 is connected to the junction between resistor R101 and Zener diode Z101, and also to a first terminal of resistor R104. The base of transistor Q101 is connected to a first terminal of resistor R105. The opposite terminal of resistor R104 is connected to wear detecting wires 20c and 20d. Until a brush 10 wears to a critical wear point determined by the protrusion of a detecting wire 20 into a brush, lines 20a, 20b, 20c, and 20d will have no fixed voltage but rather will be "floating". Should a brush wear detecting wire 20a or 20b become connected to rotor contact surface 50a due to wear of brush 10a or 10b, there will be, in the embodiment illustrated in FIG. 5, a positive voltage on wires 20a or 20b, causing a current to flow through resistor R104 into the base of transistor Q102, turning transistor Q102 on. Current then flows from wire 62 through resistor R102, the collector and emitter of transistor Q102, resistor R103, and light emitting diode LED101, which gaves a visual indication that a brush has reached the end of its useful life. Obviously, light emitting diode LED101 could be replaced with a commercially available audio indicator. Should a brush wear detecting wire 20c or 20d become connected to rotor contact surface 50b by reason of frictional wear to brushes 10c or 10d, the voltage appearing on lines 20c or 20d will cause a current to flow through resistor R105, from the base of transistor Q101, turning transistor Q101 on. Current then flows from line 62 through the emitter and collector of transistor Q101, resistor R101, to the base of transistor Q102, turning transistor Q102 on and illuminating light emitting diode LED101. It will be apparent from the disclosure herein that this warning circuit 66 could be used for a plurality of dynamoelectric machines, although it would not be able to identify which of the machines required maintenance, by putting isolation resistors between sensing wires 20 connected to brushes 10 of opposite polarity or differing voltage. It will also be obvious that, while all brushes of a dynamoelectric machine may be monitored for excessive wear, fewer brushes may be monitored using the disclosed invention. Further it will be obvious that the dynamoelectric machine involved in the system of FIG. 5 may be either an alternating current or direct current machine, of any voltage, with appropriate selection of resistors R104 and R105 and Zener diode Z101 and the addition of appropriate rectifying or blocking diodes. Resistors R104 and R105 are selected to restrict the current provided by sensing wires 20a and 20b, or 20c or 20d respectively, to that necessary to cause saturation of transistors Q102 and Q101, respectively. Zener diode Z101 is selected to limit the voltage at the junction of resistor R104 and transistor Q102 to limit the current through transistor Q102 and light emitting diode LED101, or whatever warning device may be used in its place.

Figure 6:
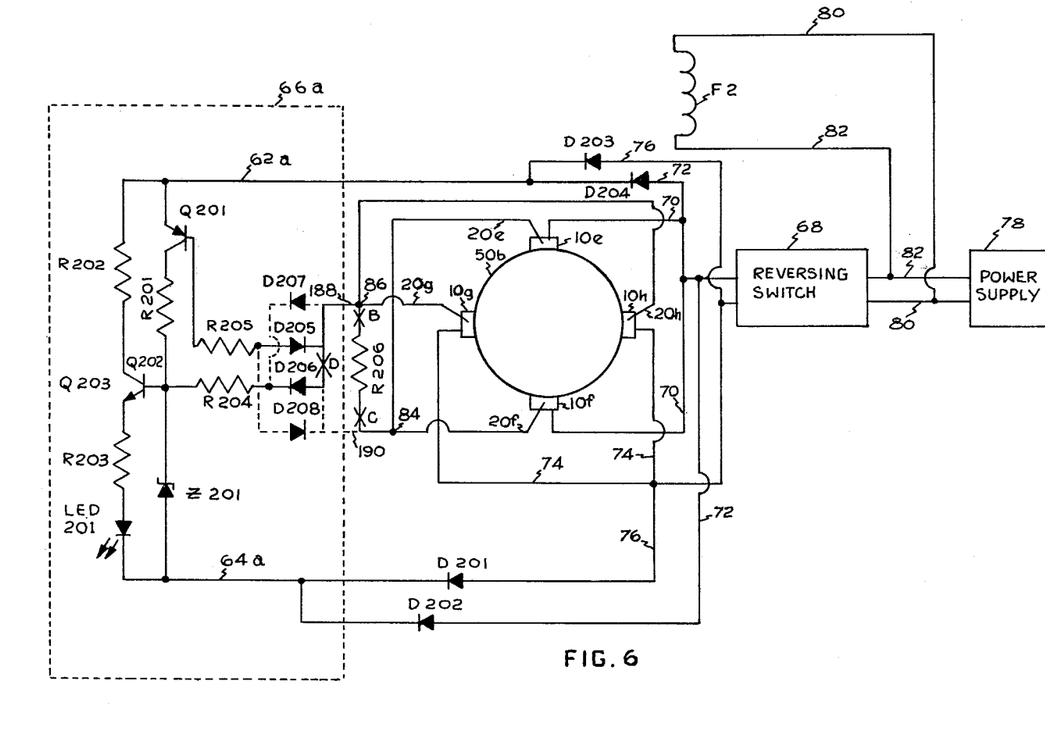
FIG. 6 is an illustration of a system according to the invention including wear detecting brushes, a shunt-wound, armature-reversing dynamoelectric machine and a warning circuit.

FIG. 6 discloses a system similar to that shown in FIG. 5, with a different type of dynamoelectric machine, shown for illustration only, and with warning circuit appropriate for use with a reversible dynamoelectric machine. In FIG. 6 diodes D201, D202, D203, D204 form a fullwave rectifier for supplying power to a warning circuit similar to that shown in FIG. 5, with equivalent components. Resistors R201, R202, R203, R204 and R205 are equivalent to resistors R101, R102, R103, R104, and R105 in FIG. 5. Transistors Q210 and Q202 are equivalent to transistors Q101 and Q102 in FIG. 5, respectively and zener diodes Z210 and light emitting diode LED210 are equivalent to zener diode Z101 and light emitting diode LED101 in FIG. 5. The dynamoelectric machine having a rotor contact surface 50b and compound field winding F2 is provided with a plurality of brushes 10, designated 10e, 10f, 10g, and 10h, provided with wear sensing lines 20e, 20f, 20g, and 20h. Brushes 10e and 10f, in contact with rotor contact surface 50a, are connected to a first terminal of reversing switch 68 through wires 70. Diodes D202 and D204 are also connected to brushes 10 through wires 72. Brushes 10g and 10h are connected to a second terminal of reversing switch 68 through wires 74. Wires 76 connect diodes D201 and D203 through brushes 10g and 10h and the second terminal of reversing switch 68. Wires 62a and 54a, equivalent to wires 62 and 64 in FIG. 5, respectively, are connected to the junctions of diodes D203 and D204 and the junction of diodes D201 and D202, respectively and supply power to the warning circuit 66a. The power supply 78 supplies power to field winding F2 and to reversing switch 68 through wires 80 and 82. Wear detecting wires 20e and 20f are joined together at a point 84. Wear detecting wires 20g and 20h are joined together at a point 86. An isolating resistor R206 is connected between point 86 and point 84. Resistor R206 insures that, should brushes connected in opposing polarity groups reach the critical wear point at the same time, wear detecting wires 20e, 20f, 20g, and 20h will not serve to short opposing groups of brushes. Point 86 is connected to the cathode of diode D205. The anode of diode D205 is connected to resistor R205. Point 86 is also connected to the cathode of a diode D206. The cathode of diode D206 is connected to resistor R204. Therefore, a positive voltage appearing at point 86 due to a sensing wire 20e, 20f, 20g, or 20h in a brush 10e, 10f, 10g, or 10h which is connected to a positive portion of rotor contact surface 50b, as determined by the position of the reversing switch 68, will cause a current to flow through diode D206 and resistor R204, turning transistor Q202 on and illuminating light emitting diode LED201. A negative voltage appearing at point 86 will cause current to flow through diode D205 and resistor R205, turning transistor Q201 on, thereby turning transistor Q202 on, and illuminating light emitting diode LED210. As before, other devices can be substituted for light emitting diode LED210 and any number of brushes 10, from a single brush 10 to all brushes 10 included in a dynamoelectric machine, maybe provided with a wear detecting wire 20, and the dynamoelectric machine may be either an alternating current machine or direct current machine, either a motor or generator, since diodes D201, D202, D203, D204, D205, and D206 insure that transistors Q210, Q202, zener diode Z201, and light emitting diode LED210 of warning circuit 66a operate with a correct voltage plurality. The use of isolating resistor R206 allows the use of a single wire 88 between a dynamoelectric machine and warning circuit 66a, with resistor R206 placed inside the motor, and all temperature sensitive components placed outside the dynamoelectric machine in a warning circuit 66a. However, a less desirable alternate circuit is also illustrated. Resistor R206 could be removed by disconnecting it at point B and C, the junction between the cathode of diode D205 and the anode of diode D206 broken at point D, and a diode D207 connected with its anode connected to point 86 and its cathode connected to the cathode of diode D206. A diode D208 maybe added, with its cathode connected to the anode of diode D206 and to point 84, and its anode connected to the anode of diode D205. These connections are shown in broken lines. The use of this alternate connections, shown in dotted lines, results in the addition of two diodes and the necessity of bringing two sensing leads, 88 and 90, from the dynamoelectric machine having armature contact surface 50a to warning circuit 66a.

Figure 7:
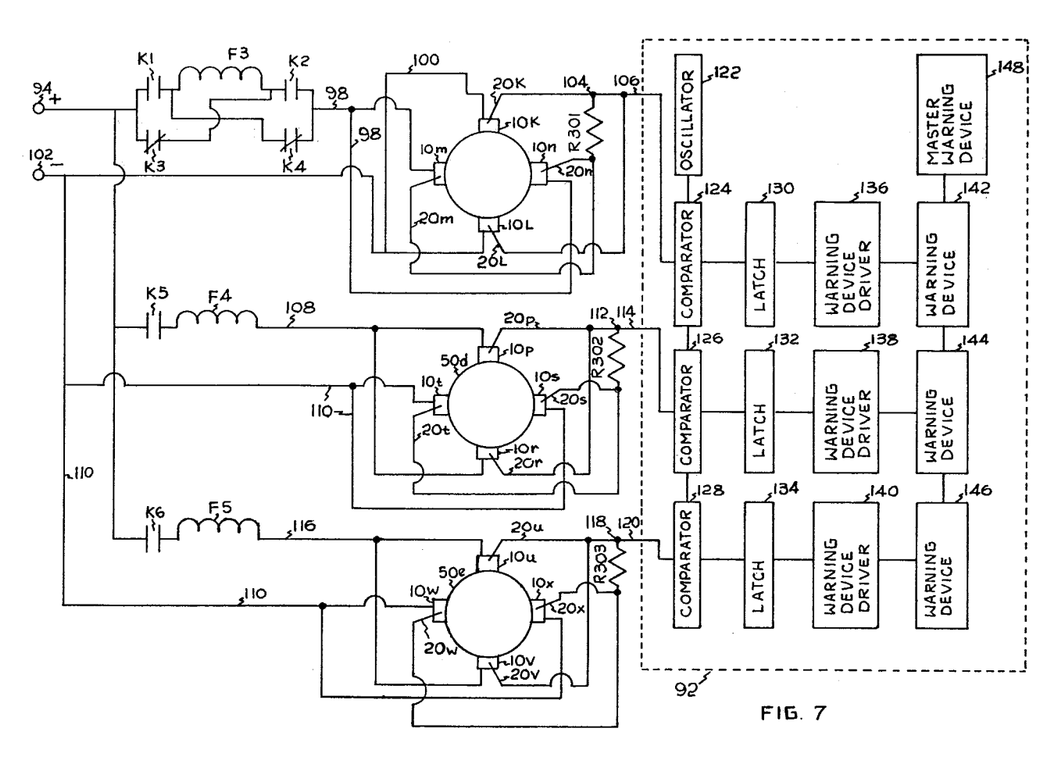
FIG. 7 illustrates a system according to the invention having a plurality of dynamoelectric machines, a plurality of wear-detecting brushes, and a warning circuit adapted for use with a plurality of dynamoelectric machines.

FIG. 7 illustrates a preferred system emboding the invention. One application of the invention is for industrial lift trucks, which have a plurality of electric motors, although the invention is also usable with a plurality of generators, and either alternating current machines or direct current machines. In a conventional lift truck, there maybe one or more motors driving hydraulic pumps for operation of the hydraulic lifting and tilting cylinders, and for driving a power steering pump, as well as one or more motors supplying motive power to the industrial lift truck. FIG. 7 illustrates, in schematic form, a system including three dynamoelectric machines having rotor contact surfaces 50c, 50d, and 50e, connected to a preferred embodiment of a warning circuit 92. A dynamoelectric machine having rotor contact surface 50c is provided with a field winding F3, which is electrically reversible by means of relay contacts K1, K2, K3, and K4. As can be seen, field F3 has a first magnetic polarity when contact K3 and K4 are closed, and second magnetic polarity when contacts K1 and K2 are closed, and K3 and K4 are opened. In the illustrative case of a dynamoelectric machine having a rotor contact surface 50c, current would flow from a power supply terminal 94, through wire 96, contacts K4 and K3 to brushes 10m and 10n through wire 98, and return from bushes 10k and 10L through wires 100 to a power supply terminal 102. Assuming the opposite direction of rotation for the illustrative dynamoelectric machine having rotor surface 50c, current would flow from power supply terminal 94 through contact K1, field winding F3, and contact K2 to brushes 10m and 10n, and return to power supply terminal 102 from brushes 10k and 10L. Brushes 10k, 10L, 10m and 10n are provided with sensing wires 20k, 20L, 20m, and 20n, respectively. Sensing wires 20k and 20L are joined together at a point 104. Sensing wires 20m and 20n are joined together at a first terminal of isolating resistor R301, the other terminal of isolating resistor R301 being connected to point 104. A wire 106 is connected from point 104 to warning circuit 92.

The dynamoelectric machine having rotor contact surface 50d is provided with a field winding F4, and is controlled by a relay contact K5. Power flows from power supply terminal 96 through contact K5, field winding F4, wire 108, to brushes 10p and 10r, and returns to the second power supply terminal 102 from brushes 10s and 10t, through wires 110. Brushes 10p, 10r, 10s, and 10t, are provided with wear detecting wires 20p, 20r, 20s, and 20t, respectively. Wear detecting wires 20p and 20r are joined together at a point 108. Sensing wires 20s and 20t are joined together at first terminal of isolating resistor R302, the second terminal of resistor R302 being connected to point 112. Point 112 is connected to warning circuit 92 through a single wire 114.

The dynamoelectric machine having armature contact surface 50e is illustrated as being identical to the dynamoelectric machine having armature contact surface 50d. It should be noted that all illustrated machines may be variable in speed, means for varying speed forming no part of the invention. In the case of the dynamoelectric machine having armature contact surface 50e, current flows from power supply terminal 94 through contact K6, field winding F5, and through wire 116 to brushes 10u and 10v, and returns from brushes 10w and 10x through wire 110 to power supply terminal 102. Brushes 10u, 10v, 10w, 10x, are provided with wear detecting wires 20u, 20v, 20w, and 20x, respectively. Wear detecting wires 20u and 20v are joined at a point 118. Wear detecting wires 20w and 20x are joined at a first terminal of a isolating resistor R303. R303 has a second terminal connected to point 118. A wire 120 is connected between point 118 in the dynamoelectric machine to warning circuit 92. Obviously, resistors R301, R302 and R304 may be removed from the dynamoelectric machines and placed in warning circuit 92, if it is desireable to bring two wires 106, 114 or 120 from each machine.

Warning circuit 92 operates by sensing when one of lines 106, 114, or 120, connected in turn to one or more wear detecting wires 20 embedded in brushes 10, is connected to a voltage due to contact with an rotor contact surface. Since sensing wires 20 are insulated, until insulation 26 is worn away by contact with the armature contact surface, no fixed voltage is present on sensing wires 20. Therefore, sensing wires 20 are said to be floating. As will be described below, warning circuit 92 operates by generating an internal sweep or oscillating voltage, and comparing the voltage present on a line 106, 114, or 120 with the oscillating voltage. As long as no brush 10 has reached the critical wear point, connecting a wear detecting wires to rotor contact surface, wear detecting wires 20 have a theoretically infinite impendance, and will follow the voltage generated by the oscillators and the comparitor will indicate no difference between the two. As soon as a sensing wire 20 makes contact with a rotor contact surface, the voltage on that wear detecting wire 20 can no longer follow that generated by the oscillator, and the comparitor indicates this condition. In the preferred embodiment of warning circuit 92, an oscillator 122 is connected to a plurality of comparitors, shown as three comparitors 124, 126 and 128. Latching or memory circuits 130, 132, and 134 are connected between warning devices drivers 136, 138 and 140, respectively. Warning devices 142, 144, and 146 are connected to warning device drivers 136, 138 and 140, respectively. A master warning device 148 is connected to warning devices 142, 144, and 146. In this manner, each dynamoelectric machine is provided with a indication that it requires maintenance in the near future, and an operator is advised, by means of a master warning device, that one of the dynamoelectric machines will require maintenance in the immediate future. The master warning device should be located within the field of view of a operator, although the individual warning devices 142, 144, and 146 may be located in a separate location, preferably in proximity to an associated dynamoelectric machine. Comparing FIG. 7 with FIGS. 5 and 6 it will be noted that FIG. 7 includes memory or latching devices 130, 132, and 134. In light of this disclosure, it will now be apparent to one skilled in the art that latching devices 130, 132, 134 are not strictly necessary to practice the invention, since a non-latching warning signal such as provided by the system shown in FIGS. 5 and 6 may be felt to be more effective in certain applications, due to the flickering or pulsation of a warning device as a wear detecting wire 20 begins to make firm contact with a rotor contact surface as a brush 10 wears. It will also be apparent that warning device drivers 136, 138 and 140 are not strictly necessary to practice the invention, since latching devices 130, 132, and 134 or comparitors 124, 126 and 128 may have adequate capacity to directly energize warning devices 142, 144, 146, and 148.

Figure 8:
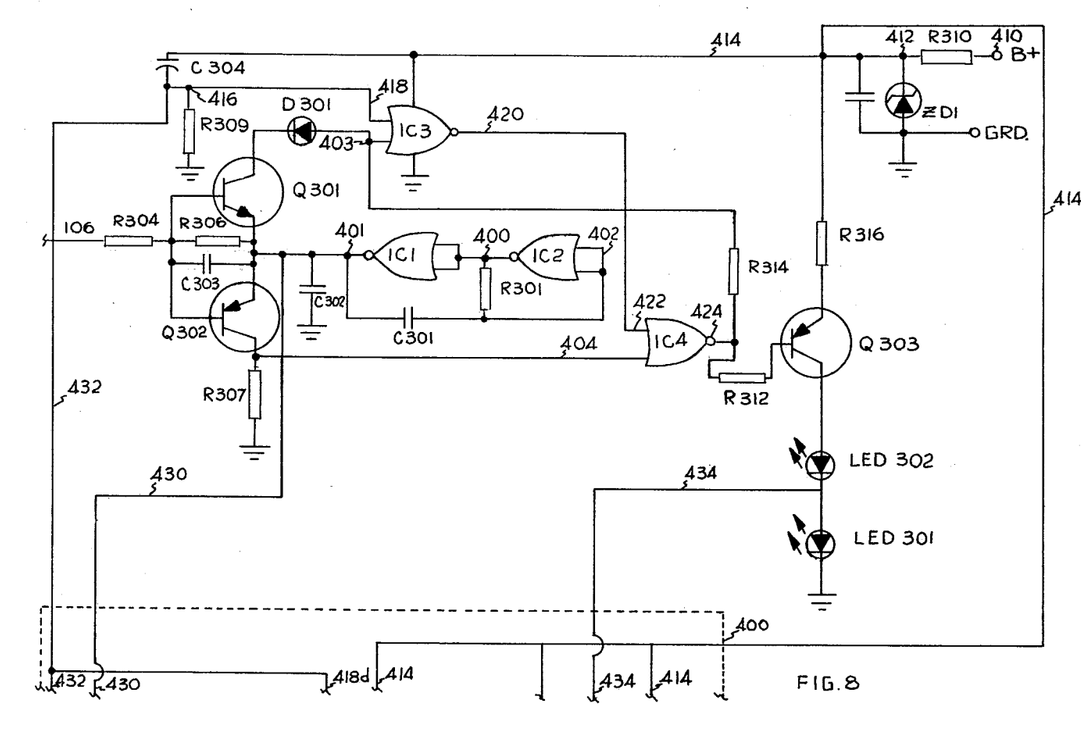
FIGS. 8, 8a and 8b are circuit diagram of a warning circuit according to the invention shown in FIG. 7.
Figure 8A:
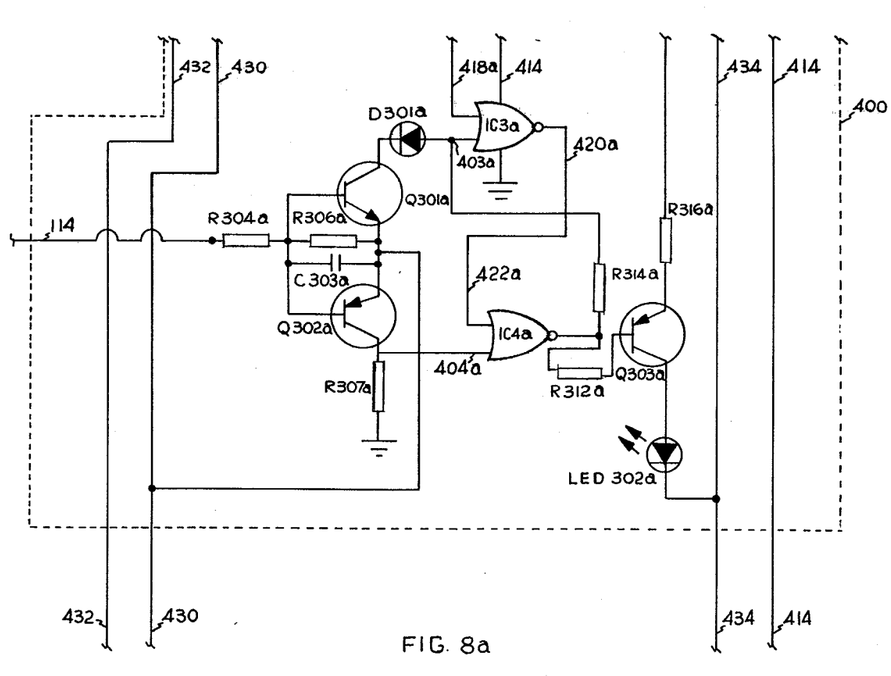
Figure 8B:
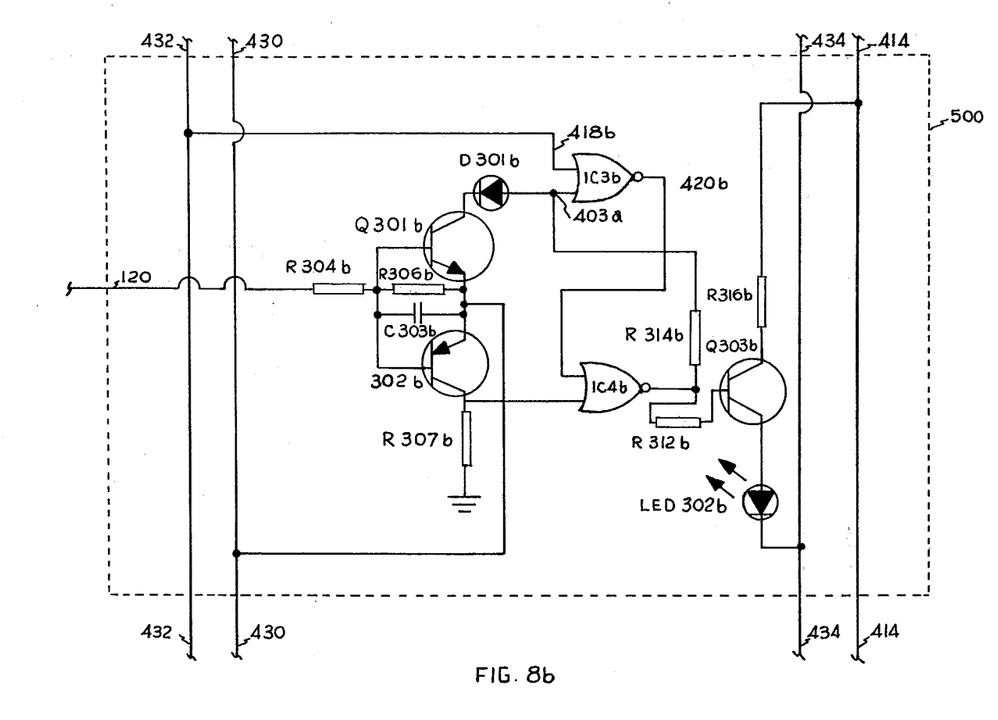

FIGS. 8, 8a and 8b illustrates an actual embodiment of the preferred form of warning circuit 92 shown in FIG. 7. In FIGS. 8, 8a and 8b logic gates IC1 and IC2, and associated components, form an oscillator such as oscillator 122 shown in FIG. 7. Logic gates IC3 and IC4 form a latch circuit such as shown as latching device 103 in FIG. 7. Similarly, logic gates IC3a and IC4a, and IC3b and IC4b, form latching circuits such as shown as latching devices 132 and 134, respectively, in FIG. 7. Transistors Q301 and Q302, and associated components, form a comparator such as shown as comparator 124 in FIG. 7. Similarly, transistors Q301a and Q302a, and transistors Q301b and Q302b, and their associated components, form comparators as shown as comparators 126 and 128, respectively, in FIG. 7. Similarly, transistors Q303, Q303a, and Q303b, and associated components, form warning device drivers shown as 136, 138, and 140 in FIG. 7. Light emitting diode LED301 is illustrative of a master warning device as shown as 148 in FIG. 7, while light emitting diodes LED302, LED302a and LED302b are illustrative of warning devices shown as 142, 144, and 146 in FIG. 7. It should be noted that preferred embodiment uses CMOS logic gates, such logic being relatively immune to being affected by random noise signals. Other types of logic, either integrated circuit or discrete devices may be substituted without varying from the scope of the invention. Due to the use of this type of logic, and its advantages, separate warning device driver, such as transistor Q303, Q303a, or Q303b is required. Obviously, substitution of components having similar characteristics but higher output capacity would eliminate the need for a warning device driver such as transistors Q303, Q303a, or Q303b. It will also be apparent from inspection of FIGS. 8, 8a and 8b that the illustrated warning circuit is modular in form, illustrated as having three substantially identical warning circuits connected to three input lines, each intended to provide a warning based on the condition of one or more among a plurality of brushes reaching a predetermined condition, such as critical wear. Of course, the utility of the circuit is not limited to sensing of signals from the devices disclosed.

As illustrated in FIGS. 7, 8, 8a and 8b, the three illustrated identical comparator circuits are connected to a plurality of brushes in each of three dynamoelectric machines. Obviously, a single comparator could be connected to all brushes in the three illustrated dynamoelectric machines, with appropriate isolation resistors.

As disclosed, it is immaterial to the circuits disclosed in FIGS. 8, 8a and 8b what is the exact voltage present on a input lead such as 106, 114, 120, as long as it does not produce a current which would be injurious to the solid sate components shown, and can be scaled to within a broad range of voltages. The comparators are composed of Q301 and Q302 and associated components, or 301a and 302a, or Q301b and Q302b, and their respective associated components. The comparitors activated whenever there is a significant different between the voltage appearing on line 106 or 114 or 120 and the output of the oscillator.

An oscillator such as oscillator 122 is composed of logic gates IC1 and IC2, resistor R310 and capacitor C301. The output of logic gate IC1, point 401, is connected to the input of logic gate IC2, point 402, through capacitor C301, and to the input of logic gate IC1 and output of logic gate IC2, point 400, through capacitor C301 and resistor R401. Therefore, output 401 provides positive feedback to input 402 through capacitor C301 and point 400 provides negative feedback to input point 402 through resistor R301, positive feedback being initially predominant. For example, at initial power turn on, points 401 and 402 are both at a low voltage state, current flowing from the resulting high voltage at point 401 until capacitor C301 is charged to a value sufficient to affect input point 402. A high voltage at point 402 causes point 400 to become a low voltage, and output point 401 to assume a high voltage state. The high voltage at point 401, acting through capacitor C301, maintains point 402 at a high voltage. Then, after a time determined by the R-C time constant of resistor R301 and capacitor C301, the low voltage at point 400, acting through resistor R310, will pull point 402 to a low voltage, forcing point 400 to a high voltage, and point 401 to a low voltage. This is the same condition as at initial power turn on. This sequence repeats and continues as long as power is applied to the circuit, the voltage at point 401 oscillating between a high voltage state and a low voltage state at a rate determined by the time constant of capacitor 301 in series with resistor R310. Capacitor C302, besides serving a function to be described later, also serves to limit the rate of transition at point 401 between high voltage and low voltage states, capacitor C302 being connected between point 401 and ground. A wire such as 106, connected to a plurality of brushes in a dynamoelectric machine in the illustrated embodiment of the invention, is normally unconnected, but may function as an antenna, and detect random noise pulses. Wire 106 is connected to a first terminal of resistor R314, a second terminal of R304 being connected to a first terminal of capacitor C302, which has a second terminal in turn connected to point 401 and capacitor C302. Noise pulses appearing on a line such as 106 will be attenuated passing through resistor 304, and pass to ground through capacitor C303 and capacitor C302.

Should a brush wear detecting wire connected to line 106 be connect to any voltage in excess of that equivalent to the base-emitter diode voltage of transistor Q301 or transistor Q302, and indication of critical brush wear will be given. Note that the disclosed circuit is capable of accepting signals ranging from a very small signal to a signal of much greater magnitude, since transistors Q301 and Q302 can accept a significantly higher current than required to initially turn either one of them on. Should a wear detecting wire 20 in a brush 10 used as a positive brush come into contact with a rotor contact surface, and the voltage then present on the rotor contact surface being positive, a current will flow through resistor R9, and resistor R2, to point 401, but only if point 401, which is the output of the oscillator, is at a low voltage level at the time. The bases and emitters of transistor Q301 and Q302 are connected together across resistor R6, transistor Q301 and Q302 being shown as having opposite polarities, transistor Q301 being shown as PNP transistor and transistor Q302 being shown as an NPN transistor. A positive voltage greater than the base-emitter diode drop of transistor Q301, developed across R310, will turn transistor Q301 on, current flowing from an input 403 of logic gate IC3 through diode D301. The function of the latching circuit, which includes logic gates IC3 and IC4 will be discussed below. Current flowing through Q301 flows to point 401, which is assumed to be at a low voltage state during its oscillation. The voltage at point 403 having been low, the oscillator output point 401 may change to a high voltage level, stopping the flow of current through resistor R304, and turning Q301 off without effecting the warning signal. The function of diode D301 is to block reverse current through transistor Q301. An undesirably high or momentary voltage spike at the base of transistor Q301 may force current to the collector of Q301, forcing point 403 to a high voltage level, and unlatching the latching circuit, after the current path through point 401 becomes unavailable as the oscillating output of logic gate IC1 forces point 401 to a high voltage level. Diode 301 prevents this.

Should a wear detecting wire 20 in a brush 10 used in a negative position become connected to an armature contact surface, and to the voltage present thereon, due to wear of the brush 10, current will flow to the wire 20 through line 106, resistor R304 and resistor R306, but only if point 401, the output of logic gate IC1 is at a high voltage level. Current flowing through R310, if capable of generating a voltage drop in resistor 306 in excess of the voltage drop of the diode formed by the base and emitter of Q302, will turn Q302 on, current then flowing from point 401 through the emitter and collector of Q302, the collector of Q302 being connected both to an input 404 of logic gate IC4 and to a first terminal of resistor R307. The opposite terminal of resistor R307 in connected to ground. Resistor R307 serves as a pull-down resistor for point 404, an input to logic gate IC4.

It should be noted that the collectors of transistors Q301 and Q302 are connected separately to logic gates IC3 and IC4 for economical reasons. A conventional NOR gate could be used to combine the outputs of transistors Q301 and Q302, for a single input to a standard latching device, or directly to a warning device, if desired.

In summary, the comparator formed in part by transistors Q301 and 302 provides a signal to the latch circuit composed of logic gates IC3 and IC4, from the collector of transistor Q401, when line 106 carries a voltage indicative of critical wear on a positive brush, and point 410, the output of oscillator logic gate IC1, is at a low voltage level, and also provides a signal to the latch circuit from the collector of transistor Q302, when line 106 carries a voltage indicative of critical wear of a negative brush, and point 401 is at a high voltage level.

The latching circuit, including logic gates IC3 and IC4, is set to a correct initial un-latched condition by means of capacitor C304 and resistor R309, forming a power-on-reset circuit. When the warning device is operating a positive voltage is applied to a terminal 419, current flowing through a resistor R310 connected to the terminal 410, the opposite terminal 421 of resistor R310 being connected to cathode of zener diode ZD1 and to a terminal of a capacitor C306, the other terminal of capacitor 306 and the anode of zener diode ZD1 being connected to ground. Zener diode ZD1 functions to stabilize voltage, passing current to ground if voltage at terminal 412 exceeds the zener voltage. Capacitor C306 limits the effect of negative transients at terminal 410. A line 414 is connected to terminal 412 and carries power to power the logic gates, and is also connected to the power-on-reset circuit formed by capacitor C304 and resistor R309. When power is initially applied, current flows through capacitor C304 and resistor R309, causing a positive voltage at the junction 416 between C304 and resistor R319, the opposite terminal of resistor R309 being connected to ground. Junction 416 is connected to a input 418 of logic gate IC3. A high voltage level appearing at this point causes a low voltage to appear on line 420, connected to the output of logic gate IC3, as well as to an input 422 of logic gate IC4, thereby causing the output 424 of logic gate IC4 to become a high voltage level. This high voltage at point 424 is applied to the base of transistor Q303 through a resistor R312, holding transistor Q303 off, and is also applied to input 403 of logic gate IC3 through a resistor R314, forcing input 403 to a high voltage level, maintaining line 420 at a low voltage level, unlatching the latching circuit. As capacitor C304 charges, the voltage at junction 416 will drop to zero but, as can be seen, if the latching circuit was latched and warning device driver transistor Q303 was on, it will be turned off, and the latching circuit will be unlatched. In this manner, turning the warning circuit on and off serves to clear the circuit after maintenance of a dynamoelectric machine, as well as to check for erroneous indications.

Then, a low voltage applied to input 403 of logic gate IC3 by transistor Q310 in response to a positive voltage appearing on line 106 while point 401 was at a low voltage will force line 420 to a high voltage state, which is applied to input 422 of logic gate IC4, making output 424 of logic gate IC4 a low voltage level, which is applied through resistor R312 to the base of transistor Q303, turning transistor Q303 on. Current then flows from line 414 through resistor R316 to the emitter of transistor Q303, and from the emitter of transistor Q303 through light emitting diodes LED303 and LED301. The illumination of light emitting diode warning device LED302 indicated that line 106 has detected a fixed voltage indicative of critical brush wear, and the illumination of warning device light emitting diode LED310 indicates that one of input lines 106, 114, or 120 has detected a fixed voltage indicative of critical brush wear. It should be noted that a voltage called a fixed voltage is any voltage that does not change at substantially the same rate as the voltage at the output of oscillator logic gate IC1, or has the same rate and phase but greater amplitude.

A negative voltage appearing on line 106 while point 401 is at a high voltage level will provide a high voltage level at input 404 of latching circuit logic gate IC4, forcing its output 424 to a low value, and energizing a warning device as described above. The low voltage also is applied to input 403 of logic gate IC3 through resistor R314, forcing line 420 and input 422 to a high voltage level, maintaining output 424 at a low voltage level, causing the latching circuit to latch with the warning devices energized.

FIGS. 8, 8a and 8b show that the warning circuit 92 shown in FIG. 7 is modular in form, having a module 400 and a module 500 which are identical to the circuit described above except for the omission of an oscillator circuit. A line 430 is connected to point 401, the output of oscillator logic gate IC1, and provides an oscillating comparison voltage to module 400 and 500. A line 432 is connected to junction 416 of the power-on-reset circuit described above, and provides this signal to modules 400 and 500. A line 434 is connected to the cathode of warning devices, light emitting diodes LED302a and LED312b, in modules 400 and 500 to the anode of the master warning device, light emitting diode LED310, so that the master warning device will give an indication whenever warning device light emitting diodes LED302, LED302a or LED302b are illuminated. In all other respects, modules 400 and 500 are identical to that described and explained above, with the omission of an equivalent for capacitor C302, whose primary function is to slow the output of oscillator logic gate IC1, a noise path for modules 400 and 500 being provided through lines 430 to capacitor C302. Although, as indicated, the warning circuit in FIGS. 8, 8a and 8b can be expanded indefinitely, only a master section and two modular sections are shown. Resistors R301, R304, R306, R307, R309, R310, R312, R314, and R316, are equivalent in description and function to resistors R301a, R304a, R306a, R307a, R309a, R310a, R312a, R314a, and R316a in module 400, and R301b, R304b, R306b, R307b, R309b, R310b, R312b, R314b, and R316b in module 500. Likewise, capacitors C301, C302, C303, C304 and C306 are the equivalents of capacitors C301a, C303a, C304a, and C306a in module 400, and capacitors C301b, C302b, C303b, C304b, and C306b in module 500. Transistors Q301, Q302, and Q303 are repeated as transistors Q301a, Q302a, and Q303 in module 400, and transistors Q301b, Q302b, Q303b in module 500. Warning device LED302 is repeated in module 400 as LED302a, and in module 500 LED303b. Likewise, input points and lines 403, 404, 418, 420, 422, and 424 are repeated as 403a, 404a, 418a, 420, 422a and 424a in module 400, and as 403b, 404b, 418b, 420b, 422, and 424b in module 500. And, as will be apparent, line 114 in module 400, and line 120 in module 500, are the equivalent of line 106, and are connected to a source, such as wear detecting lead in a brush of a dynamoelectric machine, which is either an open circuit or connected to a voltage which maybe either positive or negative or varying at a rate different or amplitude than that established by output 401 of oscillator logic gate IC1.

Numerous modifications and variations to the embodiments of the invention described above will be obvious to one skilled in the art, and may be made without departing from the scope and spirit of the invention.

I claim:

1. Apparatus for detecting the presence of a voltage upon an input lead of said apparatus which is either electrically open or connected to a voltage source, comprising:

oscillator means for providing a time-varying voltage signal;

comparison means for comparing said time-varying voltage signal and the voltage upon said input lead and providing an output signal upon detecting a difference in voltage between said time-varying voltage and the voltage upon said input lead;

said oscillator means being electrically connected to said comparison means and to said input lead;

said comparison means producing a first output when said voltage on said input lead has a positive polarity and said comparison means producing a second output when said voltage on said input lead has a negative polarity;

a warning device;

means for operating said warning device in response to said output signal of said comparison means;

latching means interposed between said warning device and said comparison means for causing said warning device to provide a continued warning after said comparison means has first detected said difference in voltage;

said comparison means including a first transistor having a first polarity and a second transistor having a second polarity;

a first terminal of said first transistor and a first terminal of said second transistor being electrically interconnected at a first point and connected to said input lead;

a second terminal of said first transistor and a second terminal of said second transistor being electrically interconnected at a second point, a resistor being connected between said first point and second point;

said second point being operably connected to said oscillator means;

current flowing through said resistor in a first direction turning said first transistor on, and current flow through said resistor in a second direction turning said second transistor on.

2. Apparatus for detecting the presence of a voltage upon an input lead according to claim 1, wherein:

current flowing through said resistor flows between said input lead and an output of said oscillator means.

3. Apparatus for detecting the presence of a voltage upon an input lead according to claim 1, wherein:

an output of said first transistor is operably connected to first input of a first logic gate;

an output of said second transistor is operably connected to a first input of a second logic gate;

said latching means including said first and second logic gates.

4. Apparatus for detecting the presence of a voltage upon an input lead according to claim 1, wherein:

said warning device is a visual warning device.

* * * * *

UNITED STATES PATENT AND TRADEMARK OFFICE
CERTIFICATE OF CORRECTION

PATENT NO. : 4,334,188

DATED : June 8, 1982

INVENTOR(S) : Carl K. Dudley

It is certified that error appears in the above-identified patent and that said Letters Patent are hereby corrected as shown below:

```
Column 10, line 14, change "a" to --an--;
           line 20, change "desireable" to --desirable--;
           line 25, change "an" to --a--;
           line 35, change "wires" to --wire--, before
"rotor" insert --a--;
           line 38, change "oscillators" to --oscillator--,
change "comparitor" to --comparator--;
           line 42, change "comparitor" to --comparator--;
           line 45, change "comparitors" to --comparators--,
two appearances;
           line 47, change "devices" to --device--;
           line 53, change "a" to --an--;
           line 58, change "a" to --an--.
Column 11, line 7, change "comparitors" to --comparators--;
           line 10, change "illustrates" to --illustrate--;
           line 16, change "103" to --130--;
           line 32, before "preferred" insert --the--;
           line 37, before "separate" insert --a--;
           line 60, change "a" to --an--;
           line 66, change "comparitors" to --comparators--;
           line 67, change "different" to --difference--.
Column 12, line 49, change "connect" to --connected--;
           line 51, change "and" to --an--.
Column 13, line 12, change "effecting" to --affecting--;
           line 34, change "in" to --is--;
           line 45, change "302" to --Q302--.
Column 14, line 8, change "a" to --an--;
           line 65, change "module" to --modules--.
Column 15, line 26, change "Q303" to --Q303a--;
           line 29, before "LED303b" insert --as--;
           line 31, change "420" to --420a--;
           line 32, change "422" to --422b--;
```

UNITED STATES PATENT AND TRADEMARK OFFICE
CERTIFICATE OF CORRECTION

PATENT NO. : 4,334,188

DATED : June 8, 1982

INVENTOR(S) : Carl K. Dudley

It is certified that error appears in the above-identified patent and that said Letters Patent are hereby corrected as shown below:

```
Column 1, line 16, change "applecation" to --application--;
          line 20, change "an" to --a--.
Column 2, line 66, change "all" to --fall--.
Column 3, line 13, change "arching" to --arcing--;
          line 19, change "a", second appearance, to
--an--;
          line 29, change "isulated" to --insulated--;
          line 65, change "a" to --an--;
          line 67, change "determined" to --determine--.
Column 4, line 36, change "diagram" to --diagrams--;
          line 41, change "refering" to --referring--;
          line 45, change "use" to --used--;
          line 47, change "varity" to --variety--;
          line 51, change "use" to --used--;
          line 60, change "usin" to --using--.
Column 5, line 5, change "a" to --an--;
          line 12, change "Refering" to --Referring--;
          line 51, insert a comma before "at" and after
"most";
          line 62, change "shut down" to --shutdown--;
          line 66, change "indentical" to --identical--.
Column 6, line 26, change "of" to --or--.
Column 7, line 24, change "gaves" to --gives--;
          line 63, before "warning" insert --a--.
Column 8, line 52, change "maybe" to --may be--.
Column 9, line 3, change "maybe" to --may be--;
          line 7, change "connections" to --connection--;
          line 12, change "emboding" to --embodying--;
          bridging lines 13 and 14, change "industrical"
to --industrial--;
          line 18, change "maybe" to --may be--;
          line 37, change "bushes" to --brushes--.
```

UNITED STATES PATENT AND TRADEMARK OFFICE
CERTIFICATE OF CORRECTION

PATENT NO. : 4,334,188            Page 3 of 3
DATED : June 8, 1982
INVENTOR(S) : Carl K. Dudley It is certified that error appears in the above-identified patent and that said Letters Patent are hereby corrected as shown below:

Column 15, line 38, change "maybe" to --may be--;
line 39, change "different or amplitude" to --or amplitude different--.
Column 16, line 29, before "second" insert --said--.

Signed and Sealed this

Fifteenth Day of March 1983

[SEAL]

Attest:

GERALD J. MOSSINGHOFF

*Attesting Officer*      *Commissioner of Patents and Trademarks*